(12) United States Patent
Berman

(10) Patent No.: US 6,837,253 B1
(45) Date of Patent: Jan. 4, 2005

(54) PROCESSING TANK WITH IMPROVED QUICK DUMP VALVE

(75) Inventor: Allan Berman, Sunnyvale, CA (US)

(73) Assignee: Imtec Acculine, Inc., Sunnyvale, CA (US)

( * ) Notice: Subject to any disclaimer, the term of this patent is extended or adjusted under 35 U.S.C. 154(b) by 282 days.

(21) Appl. No.: 10/127,161

(22) Filed: Apr. 22, 2002

(51) Int. Cl.⁷ .................................................. B08B 3/04
(52) U.S. Cl. ..................... 134/117; 134/186; 134/136; 134/902
(58) Field of Search ............................ 134/115 R, 117, 134/133, 136, 155, 183, 186, 902, 201

(56) References Cited

U.S. PATENT DOCUMENTS

| | | | | |
|---|---|---|---|---|
| 4,899,686 A | * | 2/1990 | Toshima et al. .............. 118/50 |
| 5,000,207 A | * | 3/1991 | Titterington et al. .......... 134/44 |
| 5,069,235 A | * | 12/1991 | Vetter et al. ................. 134/113 |
| 5,148,823 A | * | 9/1992 | Bran ........................... 134/184 |
| 5,484,484 A | * | 1/1996 | Yamaga et al. ............. 118/719 |
| 5,571,337 A | * | 11/1996 | Mohindra et al. ............. 134/7 |
| 5,672,212 A | * | 9/1997 | Manos ........................ 134/1.3 |
| 5,804,516 A | * | 9/1998 | Hsu et al. .................... 438/745 |
| 5,813,656 A | * | 9/1998 | Miranda ...................... 251/144 |
| 5,948,173 A | * | 9/1999 | Huh et al. ..................... 134/34 |
| 6,026,830 A | * | 2/2000 | Huang .......................... 134/66 |
| 6,029,371 A | * | 2/2000 | Kamikawa et al. ........... 34/516 |
| 6,286,524 B1 | * | 9/2001 | Okuchi et al. ............. 134/95.2 |
| 6,334,266 B1 | * | 1/2002 | Moritz et al. ................. 34/337 |
| 6,460,554 B2 | * | 10/2002 | Florez ........................ 134/183 |
| 6,503,333 B2 | * | 1/2003 | Twu et al. ..................... 134/3 |

FOREIGN PATENT DOCUMENTS

JP 4-99025 * 3/1992

* cited by examiner

Primary Examiner—Frankie L. Stinson
(74) Attorney, Agent, or Firm—Harris Zimmerman

(57) ABSTRACT

A liquid process tank that provides a quick dump feature includes a fixed bottom wall assembly and moveable tank side walls that contain liquid and also act as a quick dump valve for the liquid. The bottom wall assembly includes an acoustic transducer secured thereto. The tank side walls are secured to a plurality of linear actuators adapted for vertical movement. A seal is secured to the lower edge of the side wall assembly to impinge on a land surface that extends about the perimeter of the bottom wall assembly. The linear actuators are retracted to draw join the bottom and side wall assemblies to retain liquid, or activated in unison to drive the tank walls upwardly from the fixed bottom wall assembly, creating a bottom opening in the tank that quickly discharges all the liquid from the tank.

3 Claims, 4 Drawing Sheets

PROCESSING TANK WITH IMPROVED QUICK DUMP VALVE

REFERENCE TO RELATED APPLICATION

This application claims priority based on provisional application No. 60/283,723, filed Apr. 16, 2001.

BACKGROUND OF THE INVENTION

In the semiconductor and related industries such as flat panel displays, data storage and hard disks, the need for maintaining ultra-clean surfaces throughout multiple process and rinse steps becomes more and more rigorous as design geometries shrink and yield requirements, for reasons of competitive economy, grow. In response to this need, a multitude of cleaning and process technologies have emerged, one of which is the enhancement of both chemical process and rinsing steps with megasonic energy. It is typical to have each chemical step followed by one or more rinsing steps. This form of processing is generally carried out in a process tank located in a "wet station", and the handling of the wafers is carried out by robotic devices, although hand placement of loaded cassettes is still a frequent practice. The conservation of chemistry, the minimization of the use and waste of rinse media (typically high purity de-ionized water) and the reduction of process and rinse times have all been enhanced by the use of ultrasonic energy operating in the one megahertz region and higher. In common technical usage, "megasonic" has come to be used for any sonic cleaning device operating between 0.7–3 million hertz. While the substrate materials differ significantly depending upon the produce being manufactured, in semiconductor manufacture the substrate is most commonly called a "wafer," and for simplicity the tern wafer shall be used in this disclosure to represent all substrates in any point of manufacture.

Among the many patents in the area of this art, one of particular pertinence to the present invention is U.S. Pat. No. 5,148,823 to Mario Bran for "Single Chamber Megasonic Energy Cleaner." The first claim of this patent describes a dump valve in the lower portion of a wafer-cleaning tank that includes " . . . a moveable valve member; and a device for generating sonic energy . . . said device being mounted to move with said member." Independent claim 4 also recites the concept of a tank having a dump valve in its lower portion, the bottom wall forming a moveable valve member of the dump valve. Independent claim 6 recites a wafer cleaning tank having a tube extending from side to side in open communication with the exterior of the tank, a structure that is not relevant to the present invention.

The kernel of the invention in the Bran patent is a wafer cleaning tank having quick dump valve comprised of a moveable bottom wall of the tank, and the megasonic transducer may be secured to the moveable tank wall. The patent does not describe the fact that, in order to quickly dump the liquid contents of the tank, the bottom plate must be thrust downwards at high speed and then, perforce, must decelerate even quicker to its lower stop position at the end of the actuator retraction. This arrangement has at least two inherent structural weaknesses. First, the transducer cannot withstand such severe movement, the transducer typically being formed of a plurality of brittle crystalline members secured with adhesives to a rigid transmitting material such as, but not limited to, aluminum, quartz, synthetic sapphire or stainless steel. The assembly also includes seals of various types to the bottom plate of the tank, and the whole assembly undergoes significant mechanical shock at each opening and closing movement of a cycle.

Second, those skilled in the art of fluid flow and cleaning will understand that it is desirable for the liquid being dumped to flow down the surfaces of the wafers in as laminar a mode as possible and with as little turbulence in the wafer vicinity as possible. One of the worst places to have turbulence is in the bottom of the tank, adjacent to the lower portion of the wafers, as heavy particles, loosened by the megasonic energy, and escaping from the cascading overflow stream (if overflow is provided) will settle to the bottom of the tank. In the Bran arrangement the bottom plate drops rapidly, causing the liquid in the tank to fall upon that bottom plate, rebound against the upper descending stream and produce instantaneous turbulence that propels contaminating particles, which had been resting on the bottom plate, back up into a region of contact with the wafer load.

Thus it is apparent that the prior art is ripe for improvement.

SUMMARY OF THE INVENTION

The present invention generally comprises a wafer cleaning tank that provides a quick dump (quick discharge) valve feature that does not engender turbulence in the tank liquid. Moreover, the invention protects the acoustic transducer on the bottom wall from mechanical shock loads which my occur in drop-bottom tank designs of the prior art.

The invention generally includes a wafer cleaning tank that is constructed of a fixed bottom wall assembly and moveable tank side walls that contain liquid and also act as a quick dump valve for the liquid. The bottom wall assembly includes an acoustic transducer secured thereto and disposed to radiate acoustic energy upwardly from the bottom wall to a plurality of wafers supported in the tank in vertically oriented, parallel, spaced apart arrangement. The transducer is dimensioned to be at least as large as the array of wafers, whereby all the wafers receive the acoustic energy in approximately equal measure.

The tank side walls are not secured to the bottom wall assembly. Rather, in one embodiment a plurality of linear actuators are secured between side and end walls of the tank and the bottom wall assembly. A seal such as an O-ring or gasket seal is secured to the lower edge of the side wall/end wall assembly, and is adapted to impinge on a land surface that generally extends continuously about the perimeter of the bottom wall assembly. The linear actuators may be retracted to draw together the bottom assembly and the side wall/end wall assembly, the O-ring forming a seal therebetween that enables the tank to retain liquid for wafer processing purposes. The linear actuators may be activated in unison to drive the tank walls upwardly from the fixed bottom wall assembly, creating a 360° opening in the bottom of the tank that quickly discharges all the liquid from the tank substantially evenly around the periphery.

In an alternative embodiment, the side wall assembly may be secured to a plurality of linear actuators that are supported independently of the bottom wall assembly. For example, a plurality of stanchions may extend upwardly adjacent to the tank, and linear actuators such as kinematic linkages, rack and pinion assemblies or screw jack assemblies extend from the stanchions to the tank. The bottom wall assembly is fixedly supported independently of the stanchions. The linear actuators may be activated to drive the side wall assembly vertically between a lower position in which a sealing engagement is established with the bottom wall assembly, to an upper position in which a discharge opening is established about the perimeter of the bottom wall assembly.

The structure of the present invention improves upon the prior art in at least two aspects. One, the fixed bottom wall assembly experiences far less mechanical shock than prior art moving bottom wall designs. Thus the transducer is expected to have a far longer MTBF. Secondly, before dumping, the liquid in the tank is statically resting against the tank bottom; when the sides are raised to initiate the liquid dump, the first movement of the liquid is to exit in all lateral directions in a smooth sheet-like laminar flow, without creating turbulence, as in prior art designs. Thus contaminants that may have settled to the bottom of the tank are swept away laterally, and are not brought into contact with the wafers being processed in the tank.

DESCRIPTION OF THE PREFERRED EMBODIMENT

Figure 1:
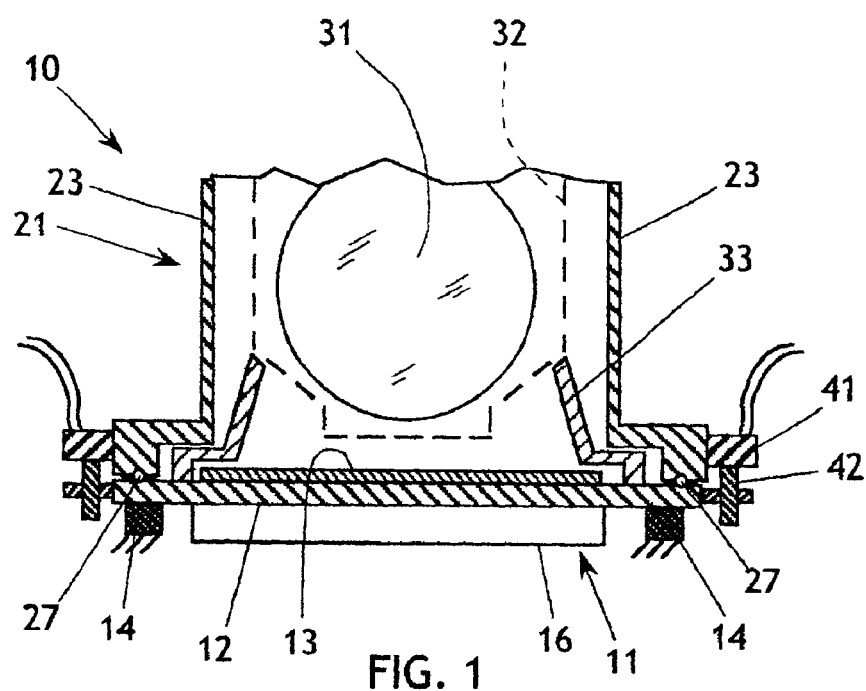
FIG. 1 is a cross-sectional end elevation of the wafer processing tank of the present invention.

The present invention generally comprises a cleaning tank for substrates, such as semiconductor wafers, that provides a unique and beneficial quick dump (quick discharge) valve design. With regard to FIGS. 1–5, in one embodiment of the invention the tank 10 of the invention includes a bottom wall assembly 11, comprised of a bottom panel 12 and an acoustic transducer 13 secured to the upper surface of the panel 12. The bottom panel 12 is secured to a fixed support 14, so that the bottom wall assembly is immobilized and cannot move. A housing 16 depends from the panel 12 and encloses the electronics that operate the transducer 13.

The tank 10 also includes a side wall assembly 21, comprised of paired end walls 22 and paired side walls 23 arranged in a generally rectangular format and joined to form a contiguous side wall. A flange 24 extends outwardly from the lower edge of the contiguous side wall. The flange 24 extends continuously and includes a lower surface 26 that supports a seal 27 such as an O-ring or the like. The bottom wall assembly 11 includes a peripheral surface 28 that comprises a land surface in complementary layout to the O-ring seal to form a sealing engagement therewith. When the O-ring seal 27 is impinged on the surface 28, as shown in FIG. 1, the bottom wall and sidewall assemblies are joined to form a generally rectangular container for conducting procedures such as wafer processing. A plurality of wafer disks 31 may be supported in parallel, spaced apart fashion in a cassette holder 32, and the tank 10 is provided with a bracket 33 secured to the bottom wall assembly to support a cassette holder. Thus wafers 31 may be immersed in liquid and subjected to high levels of megasonic energy, for example, for cleaning purposes. The cassette is handled and manipulated by either a robotic device or manually to place the cassette in the tank and remove it when required.

Note that the seal between the bottom and side wall assemblies may be formed by arrangements other than an O-ring. For example, a gasket seal may be provided, or interlocking or mating lips and flanges, or combinations thereof, or other equivalent structures.

Figure 2:
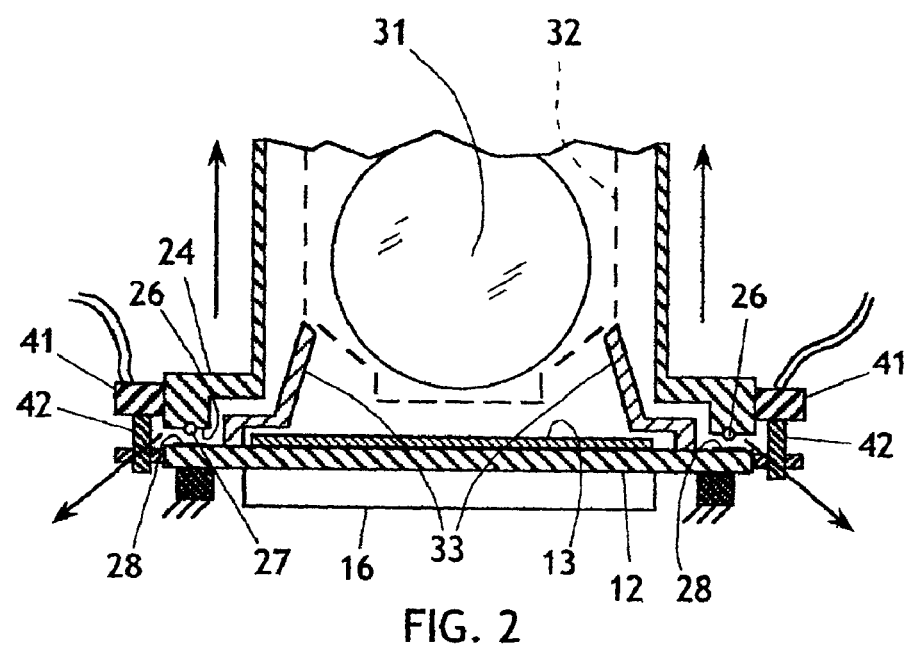
FIG. 2 is a cross-sectional elevation as in FIG. 1, showing the wafer processing tank with the quick dump valve open.
Figure 3:
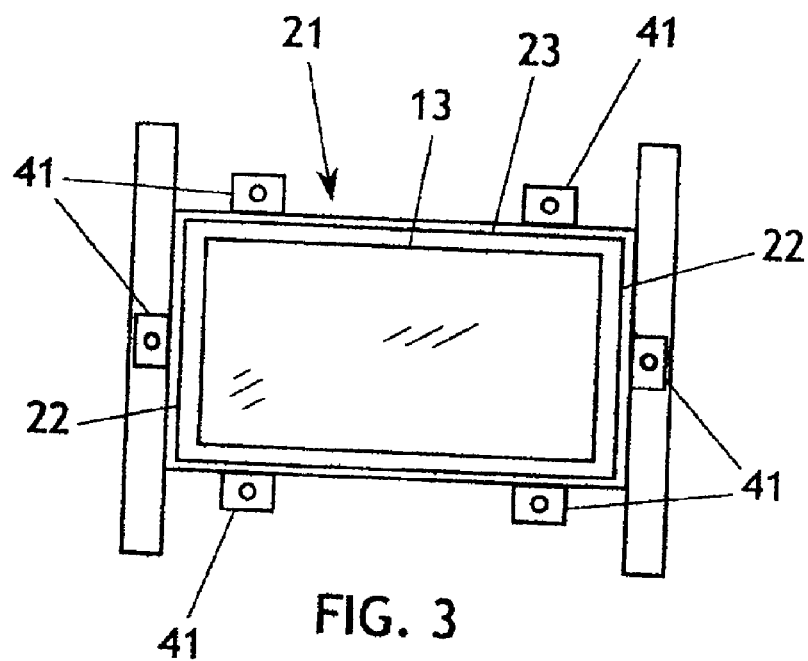
FIG. 3 is an open top view of the wafer processing tank of the present invention.
Figure 4:
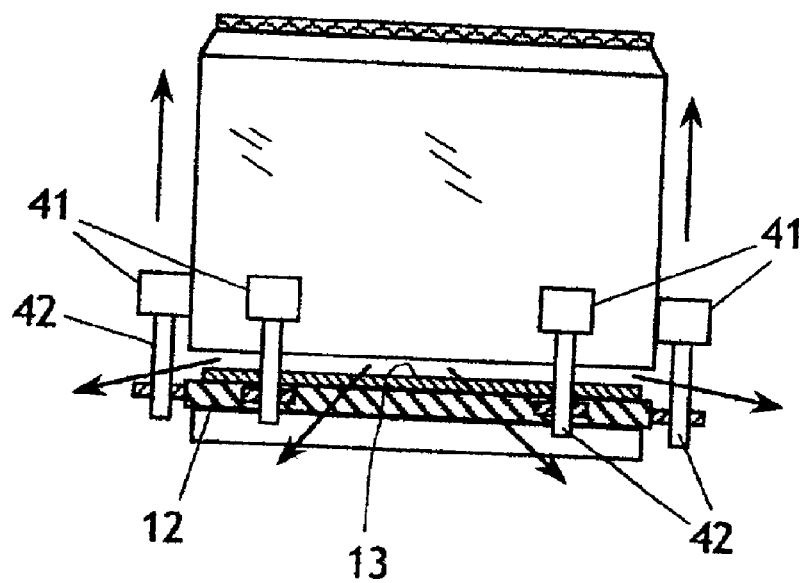
FIG. 4 is a side elevation of the wafer processing tank of the invention, shown with the quick dump valve open as in FIG. 2.
Figure 5:
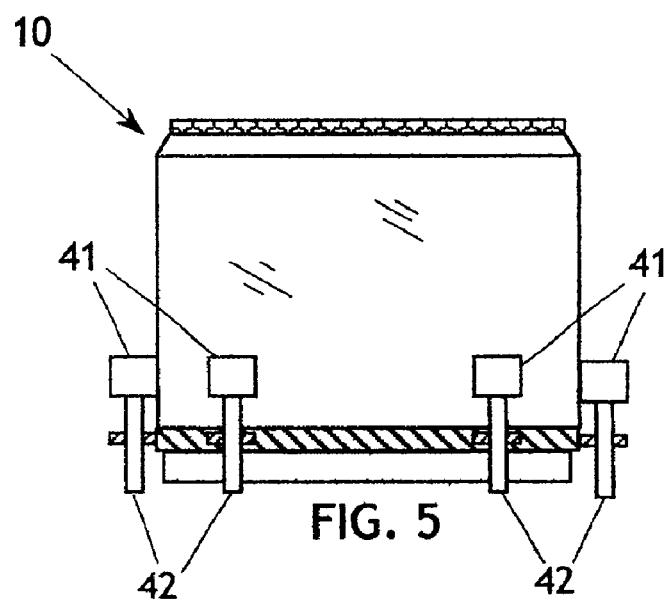
FIG. 5 is a side elevation as in FIG. 4, showing the wafer processing tank with the quick dump valve closed.

The tank 10 further includes a plurality of double-acting, short stroke actuators 41 arrayed about the perimeter of the bottom wall assembly 1 land side wall assembly 21. For example only, two actuators 41 may be secured at each side wall, and one actuator 41 secured to each end wall, as shown in FIGS. 3–5. The actuators may be operated pneumatically, hydraulically, electromagnetically, or the like. The motive element 42 of each actuator 41 is connected between the side wall assembly 21 and the bottom wall assembly 11; with the motive elements retracted, as shown in FIGS. 1 and 5, the O-ring seal is closed and the tank is disposed to retain a charge of liquid. However, the elements 42 may be quickly extended to raise the side wall assembly and open substantially the entire perimeter of the tank at the bottom thereof, as shown in FIG. 2 and especially 4, to discharge the liquid in the tank. This quick discharge arrangement assures that the first movement of the liquid from the tank is to exit in all lateral directions in a smooth, substantially laminar flow from the outer lower perimeter of the charge of liquid. This arrangement minimizes turbulence during the quick discharge outflow, and limits exposure of the wafers in the tank to contaminants that may have settled to the bottom of the tank. Note also that the bottom wall assembly remains statically mounted to the support structure 14 during the opening and closing of the quick dump feature of the invention.

It may be appreciated that there are a variety of ways to seal the side wall assembly to the bottom plate when the actuators are retracted. Likewise, there are a variety of ways to seal properly the transducer plate to the bottom plate. The transducer may be sealed to the bottom of the plate, and an adequately sized cutout may be provided therefore, although a cutout is not necessarily required. Also, if robotic devices are used to support the wafer cassette in situ, the supports 33 may be eliminated.

Figure 6:
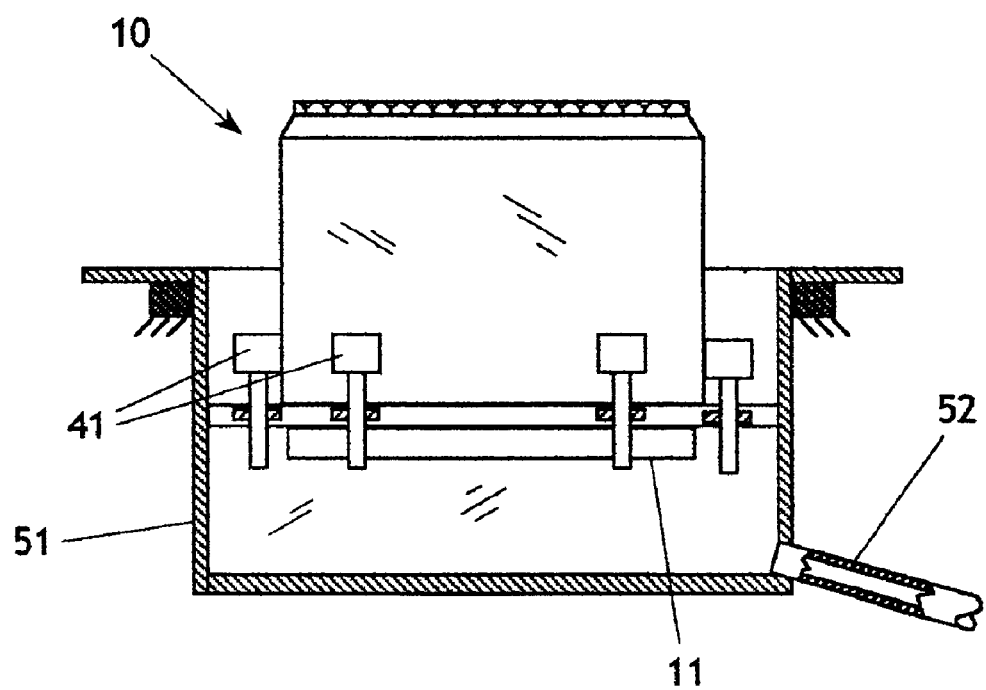
FIG. 6 is a side elevation of a further embodiment of the invention in which the wafer processing tank is suspended within a containment vessel for the quick dump liquid outflow.

There are also numerous ways to immobilize and support the bottom plate depending on fit, location, and function within its operating area, typically a wafer fabrication wet station. With regard to FIG. 6, one possible mounting arrangement includes the tank 10 disposed within a containment chamber 51 that is disposed to capture the liquid from the quick dump discharge of the tank 10. The chamber 51 includes a drain 52 for the effluent from the tank 10, and may connect to a recirculation circuit or to waste. The bottom wall assembly 11 of the tank 10 may be supported by the side walls of the containment chamber 51.

The linear actuators may be inverted with respect to the side wall and bottom wall assemblies. Alternatively, linear actuators may be used in an arrangement that is independent of the bottom wall assembly. With regard to FIG. 7, a further embodiment of the invention includes a bottom wall assembly 11, substantially as described above, supported fixedly on legs 66 (or any other immobile support arrangement). A side wall assembly 63, similar to the assembly 10 described above, is adapted to sealingly engage the bottom wall assembly to form a process tank for wafer processing and the like. Disposed adjacent to the bottom wall assembly are a plurality of stanchions 61 extending upwardly, each stanchion 61 supporting a linear actuator 62. Each linear actuator 62 is engaged with a portion of the side wall assembly, the actuators 62 being disposed to translate the side wall assembly vertically. The side wall assembly moves between a lower position in which the side wall assembly engages the bottom wall assembly 11 in sealing fashion to form a liquid containing tank, to an upper position in which the side wall assembly is spaced apart from the bottom wall assembly to define a peripheral opening that acts as a quick dump outlet for the tank. Note that the linear actuators do not extend between the bottom wall assembly and side wall assembly.

The linear actuators may comprise screw jacks, pneumatic or hydraulic cylinders, solenoid actuators, or the like.

Figure 7:
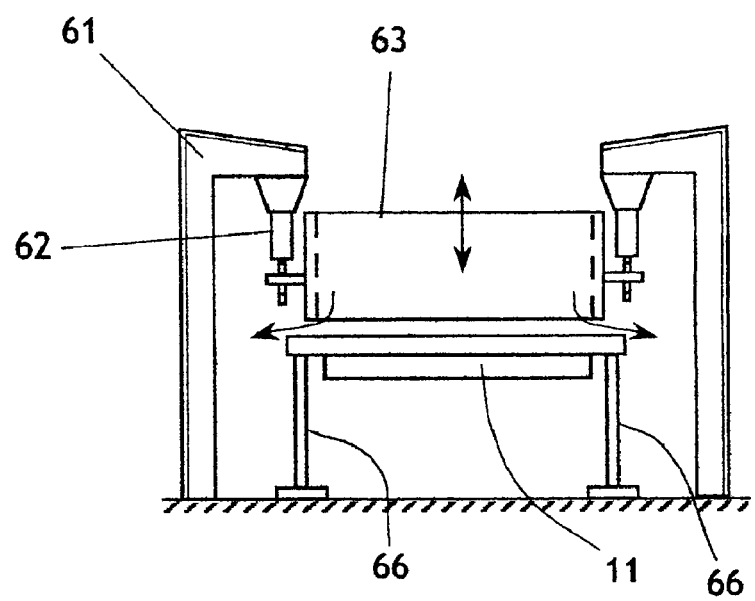
FIG. 7 is a side elevation of a further embodiment of the invention in which the quick dump valve actuators are independent of the bottom wall assembly.
Figure 8:
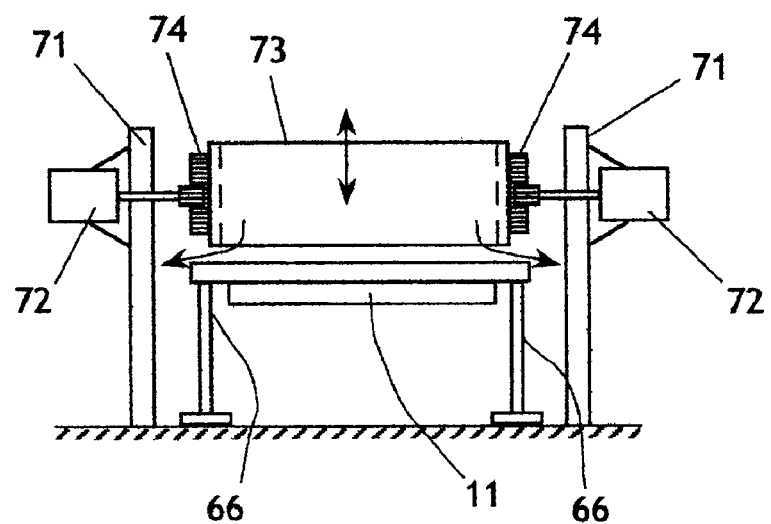
FIG. 8 is a side elevation of another embodiment of the invention in which the quick dump valve actuators are independent of the bottom wall assembly.

With regard to FIG. 8, a variant of the embodiment of FIG. 7 provides the bottom wall assembly 11 with immobile support legs 66. A plurality of stanchions 71 are disposed adjacent to the bottom wall assembly, each stanchion supporting a stepper motor 72 that drives a pinion gear. A side wall assembly 73, similar to assemblies 10 or 63 described previously, is adapted to sealingly engage the bottom wall assembly to form a process tank for wafer processing and the like. The assembly 73 is provided with a plurality of gear racks 74, each engaged by a respective pinion extending from the assembly 72, whereby the side wall assembly may be translated vertically. The side wall assembly 73 moves between a lower position in which the side wall assembly engages the bottom wall assembly 11 in sealing fashion to form a liquid containing tank, to an upper position in which the side wall assembly 73 is spaced apart from the bottom wall assembly to define a peripheral opening that acts as a quick dump outlet for the tank. As in the embodiment of FIG. 7, the linear actuators do not extend between the bottom wall assembly and side wall assembly.

The present invention improves upon the prior art in that the fixed bottom wall assembly experiences far less mechanical shock that prior art moving bottom wall designs. Thus the transducer is expected to have a far longer MTBF. In addition, the liquid in the tank is statically resting against the tank bottom before dumping; when the sides are raised to initiate the liquid discharge, the first movement of the liquid is to exit laterally 360° in all directions in a smooth sheet-like laminar flow through and adjacent to the substrates, without creating turbulence as in prior art designs. Thus contaminants that may have settled to the bottom of the tank are swept away laterally, and are not brought into contact with the wafers being processed in the tank.

The foregoing description of the preferred embodiment of the invention has been presented for purposes of illustration and description. It is not intended to be exhaustive or to limit the invention to the precise form disclosed, and many modifications and variations are possible in light of the above teaching without deviating from the spirit and the scope of the invention. The embodiment described is selected to best explain the principles of the invention and its practical application to thereby enable others skilled in the art to best utilize the invention in various embodiments and with various modifications as suited to the particular purpose contemplated. It is intended that the scope of the invention be defined by the claims appended hereto.

What is claimed is:

1. A liquid processing tank, including:
    a bottom wall assembly, and means for supporting and immobilizing said bottom wall assembly;
    a side wall assembly operatively associated with said bottom wall assembly;
    sealing means extending between a lower edge portion of said side wall assembly and said bottom wall assembly, said sealing means releasably joining together said side wall assembly and said bottom wall assembly to define a liquid-containing enclosure;
    actuator means for moving said side wall assembly from a first, retracted disposition in which said sealing means is joined to define said liquid-containing enclosure, to a second, extended disposition in which said lower edge portion is separated from said bottom wall assembly to define a quick discharge outlet at the lower periphery of said enclosure, means in said tank for supporting a plurality of wafers above said bottom wall assembly with said wafers adapted to be positioned below the upper edge portion of said side wall assembly when said side wall assembly is in said first retracted position, said discharge outlet extending substantially completely around the periphery of said bottom wall assembly, the spacing between said wafer supporting means and said bottom wall assembly being substantially the same irrespective of the disposition of said side wall assembly.

2. The liquid processing tank of claim 1, further including an acoustic transducer secured to said bottom wall assembly and directed upwardly therefrom.

3. The liquid processing tank of claim 2, wherein said acoustic transducer comprises a flat panel secured to said bottom wall assembly and having a lateral extent greater than the lateral extent of any wafers supported by said wafer supporting means.

* * * * *